United States Patent
Urfels et al.

(10) Patent No.: US 11,547,000 B2
(45) Date of Patent: Jan. 3, 2023

(54) RESISTOR COMPONENT FOR SURFACE MOUNTING ON A PRINTED CIRCUIT BOARD AND PRINTED CIRCUIT BOARD WITH AT LEAST ONE RESISTOR COMPONENT ARRANGED THEREON

(71) Applicant: Heraeus Nexensos GmbH, Kleinostheim (DE)

(72) Inventors: Stephan Urfels, Kleinostheim (DE); Tim Asmus, Kleinostheim (DE); Stefan Dietmann, Kleinostheim (DE); Karlheinz Wienand, Aschaffenburg (DE)

(73) Assignee: Heraeus Nexensos GmbH, Kleinostheim (DE)

( * ) Notice: Subject to any disclaimer, the term of this patent is extended or adjusted under 35 U.S.C. 154(b) by 0 days.

(21) Appl. No.: 17/277,577

(22) PCT Filed: Aug. 7, 2019

(86) PCT No.: PCT/EP2019/071193
§ 371 (c)(1),
(2) Date: Mar. 18, 2021

(87) PCT Pub. No.: WO2020/057850
PCT Pub. Date: Mar. 26, 2020

(65) Prior Publication Data
US 2021/0307178 A1 Sep. 30, 2021

(30) Foreign Application Priority Data
Sep. 19, 2018 (DE) .................... 20 2018 004 354.0

(51) Int. Cl.
*H05K 3/34* (2006.01)
*H01C 1/028* (2006.01)
(Continued)

(52) U.S. Cl.
CPC .......... *H05K 3/3415* (2013.01); *H01C 1/028* (2013.01); *H01C 7/003* (2013.01); *H05K 1/0306* (2013.01); *H05K 1/181* (2013.01)

(58) Field of Classification Search
CPC ...... H01C 1/028; H01C 7/003; H05K 3/3415; H05K 1/0306; H05K 1/181
See application file for complete search history.

(56) References Cited

U.S. PATENT DOCUMENTS

| 5,111,179 A | * | 5/1992 | Flassayer | H01C 1/142 338/307 |
| 5,294,910 A | * | 3/1994 | Tani | G01K 7/183 338/332 |

(Continued)

FOREIGN PATENT DOCUMENTS

| CN | 101951726 | 1/2011 |
| CN | 103380467 | 10/2013 |

(Continued)

OTHER PUBLICATIONS

Written Opinion and International Search Report dated Nov. 5, 2019 in PCT/EP2019/071193.

*Primary Examiner* — Kyung S Lee
(74) *Attorney, Agent, or Firm* — Dicke, Billig & Czaja, PLLC

(57) ABSTRACT

One aspect is a resistor component for surface mounting on a printed circuit board, including a ceramic substrate with a first side and an opposite second side. A sinterable metallization is at least in some regions arranged on the second side. A resistance element comprising a metal layer is arranged at least in some regions on the first side of the ceramic substrate with a first connection and a second connection. An insulation layer is arranged at least in some regions on the resistance element and the ceramic substrate. A first region on the first connection and a second region on (Continued)

Figure 1A:
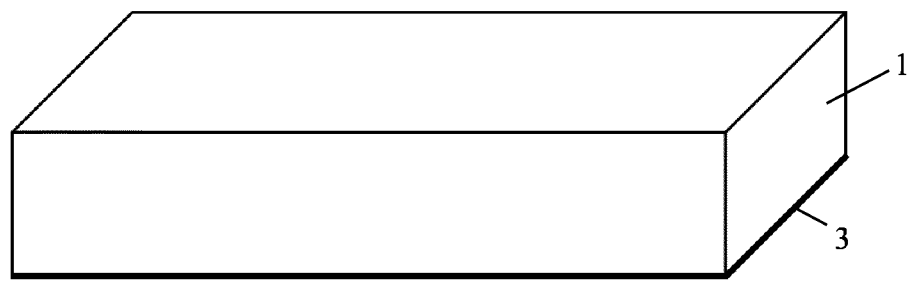

the second connection remain uncovered by the insulation layer. A first contact pad electrically contacts the first connection via the first region, and a second contact pad electrically contacts the second connection via the second region. The first contact pad at least in some regions covers a first surface region of the insulation layer and the second contact pad at least in some regions covers a second surface region of the insulation layer, and the first and the second contact pads are arranged spatially separated from one another on the insulation layer.

14 Claims, 2 Drawing Sheets

(51) Int. Cl.
  *H01C 7/00* (2006.01)
  *H05K 1/03* (2006.01)
  *H05K 1/18* (2006.01)

(56) References Cited

U.S. PATENT DOCUMENTS

| | | | | |
|---|---|---|---|---|
| 5,406,246 | A * | 4/1995 | Friese | G01K 7/18 338/307 |
| 7,190,252 | B2 * | 3/2007 | Smith | H01C 1/144 338/226 |
| 8,698,593 | B2 * | 4/2014 | Park | H01C 17/06526 338/307 |
| 9,040,338 | B2 | 5/2015 | Eisele | |
| 9,153,762 | B2 | 10/2015 | Miura | |
| 9,508,473 | B2 | 11/2016 | Yoneda | |
| 9,911,524 | B2 * | 3/2018 | Tanaka | H01C 17/242 |
| 10,192,658 | B2 * | 1/2019 | Matsumoto | H01C 17/065 |
| 10,276,285 | B2 * | 4/2019 | Matsumoto | H01C 1/142 |
| 10,342,138 | B2 | 7/2019 | Kondo et al. | |
| 10,438,729 | B2 * | 10/2019 | Wyatt | H01C 1/148 |
| 10,446,295 | B2 | 10/2019 | Hiroshima | |
| 11,011,290 | B2 * | 5/2021 | Abe | H01C 1/148 |
| 2002/0043712 | A1 * | 4/2002 | Efland | H01L 23/5286 257/E23.079 |
| 2006/0225269 | A1 | 10/2006 | Zitzmann et al. | |
| 2008/0093355 | A1 * | 4/2008 | Ose | H05B 3/746 219/448.13 |
| 2018/0090247 | A1 * | 3/2018 | Matsumoto | H01C 1/148 |
| 2018/0137957 | A1 | 5/2018 | Choi | |
| 2018/0286541 | A1 * | 10/2018 | Matsumoto | H01C 17/006 |
| 2019/0228886 | A1 * | 7/2019 | Yoneda | H01C 1/142 |

FOREIGN PATENT DOCUMENTS

| | | |
|---|---|---|
| CN | 103403862 | 11/2013 |
| CN | 108074690 | 5/2018 |
| DE | 10 2010 050 315 | 5/2012 |
| EP | 0 484 756 | 5/1992 |
| JP | 3665385 | 6/2005 |
| JP | 2006-080322 | 3/2006 |
| JP | 2010182891 | 8/2010 |
| JP | 2013153137 | 8/2013 |
| JP | 2017135234 | 8/2017 |
| JP | 2018026410 | 2/2018 |
| KR | 2018-0072489 | 6/2018 |
| RU | 2 158 419 | 10/2000 |

* cited by examiner

RESISTOR COMPONENT FOR SURFACE MOUNTING ON A PRINTED CIRCUIT BOARD AND PRINTED CIRCUIT BOARD WITH AT LEAST ONE RESISTOR COMPONENT ARRANGED THEREON

CROSS REFERENCE TO RELATED APPLICATION

This Utility Patent Application claims priority under 35 U.S.C. § 371 to International Application Serial No. PCT/EP2019/071193, filed Aug. 7, 2019, which claims the benefit of German Patent Application No. DE 20 2018 004 354.0, filed Sep. 19, 2018; which are both incorporated herein by reference.

The present invention relates to a resistor component for surface mounting on a printed circuit board. The present invention further relates to a printed circuit board with at least one resistor component arranged thereon.

In power semiconductor modules, electronic components such as, for example, resistor components are set on printed circuit boards by surface mounting. For this purpose, resistor components that have no wire connections are often soldered directly to the printed circuit board by means of solderable connection surfaces.

Sinterable resistor components such as, for example, temperature sensors or resistors for the power electronics can also be arranged on the printed circuit board by surface mounting. For this purpose, usually cylindrical components having a certain lower side which is usually metallized and flat are electrically connected to a surface of the printed circuit board by means of a sintering layer, for example, a silver-containing sinter paste. The contacting can occur by means of the metallized lower side and at least one contact pad which is arranged on an upper side of the resistor component opposite the lower side. In order to achieve higher electrical loads, the contacting can also occur by two contact pads arranged on the upper side of the resistor component and held electrically insulated with respect to the metallized lower side. The upper-side contacting of the contact pad usually occurs by wire bonding, soldering or sintering. DE102010050315B4 describes, for example, an electrical component with contact pads for contacting on the upper side of the electrical component and with an opposite electrically insulated metallization for sintering on potential-bearing surfaces such as, for example, on a conducting path which runs over the printed circuit board.

However, the contact surfaces of the resistor components for surface mounting known from the prior art are often designed with considerable spatial limitation due to the small dimensions of the resistor component. Therefore, a reliable electrical contacting of the contact pads can be achieved only with difficulty.

The aim of the present invention therefore is to provide an improved resistor component for surface mounting on a printed circuit board.

This aim is achieved according to the invention with a resistor component according to the subject matter of claim 1.

The resistor component according to the invention for surface mounting on a printed circuit board for this purpose comprises:

a ceramic substrate with a first side and an opposite second side, wherein a sinterable metallization is at least in some regions arranged on the second side;

a resistance element comprising a metal layer arranged at least in some regions on the first side of the ceramic substrate with a first connection and a second connection;

an insulation layer arranged at least in some regions on the resistance element and the ceramic substrate, wherein a first region on the first connection and a second region on the second connection remain uncovered by the insulation layer; and a first contact pad which electrically contacts the first connection via the first region, and a second contact pad which electrically contacts the second connection via the second region; wherein the first contact pad at least in some regions covers a first surface region of the insulation layer, and the second contact pad at least in some regions covers a second surface region of the insulation layer, and the first and the second contact pads are arranged spatially separated from one another on the insulation layer.

The ceramic substrate can comprise, for example, one or more materials from the group: $Al_2O_3$, AlSiC, AlN, $B_4C$, BN, PBN, MgO, SiC, SiSiC, SSiC, $Si_3N_4$, YSZ or PZT, and can be provided in the form of a plate, for the construction of a plurality of resistor components on the ceramic substrate. After the construction of the resistor components, the ceramic substrate can be structured in order to obtain the individual resistor components. The electrically insulating properties of the ceramic substrate allow an arrangement of the contact pads on the first side of the ceramic substrate, which are held electrically insulated with respect to the metallized second side of the ceramic substrate.

The sinterable metallization can comprise, for example, one or more materials from the group: NiAu, NiPdAu, AgPd, AuPd, Au, Ag or Cu, and can be arranged in some regions or completely on the second side of the ceramic substrate.

The resistance element according to the invention comprises a metal layer with a first connection and a second connection or is produced with the metal layer. The metal layer is arranged at least in some regions on the first side of the ceramic substrate. The metal layer can be formed as a conducting path which runs flat, in a meandering pattern or helically between its ends, and which has a defined resistance value and temperature coefficient at a certain temperature.

Insulation layer can be understood to be an electrically insulating layer, for example, a glass ceramic, which is arranged on regions of the metal layer and on regions of the first side of the ceramic substrate which are not covered by the metal layer. A first region on the first connection and a second region on the second connection remain entirely uncovered by the insulation layer.

For example, the insulation layer can completely cover a first side of the ceramic substrate up to the first region via the first connection and up to the second region via the second connection. The uncovered first region and second region can be designed as openings which allow an electrical contacting of the respective connection, for example, via a section of an electrical conductor which extends through the openings in the insulation layer and which allows a contacting of the connections on the side of the insulation layer facing away from the first surface of the ceramic substrate. The electrical contacting of the connections can also be established directly by the material of the contact pad. The term "opening" can also be understood to be a recess or an uncovered region of the insulation layer of the first side of the ceramic substrate, lying under the insulation layer.

The contact pads each cover a surface region of the insulation layer. "Contact pad" can be understood to mean a thin layer of an electrically conducting material, which is arranged substantially flat on the surface of the insulation layer and which is indirectly or directly connected to a connection of the metal layer.

"Arranged spatially separated on the insulation layer" can be understood to mean an arrangement of the first contact pad and of the second contact pad on the insulation layer so that the two contact pads do not contact one another.

By means of the invention, one has succeeded in providing for the first time a resistor component for surface mounting on a printed circuit board with contact pads which, due to their arrangement, provide, at least in some regions on the insulation layer, a sufficiently large surface area for the contacting with thick wire, for example, by ball bonding or wedge bonding.

In an example, the first and the second surface regions together cover at least 70% of a total surface of the insulation layer on the first side of the ceramic substrate.

Advantageously, in the resistor component according to the invention, almost all of the surface region of the insulation layer, which again can extend over the second side of the ceramic substrate, is available. Thus, the surface of the contact pads can be considerably increased in comparison to the resistor components known from the prior art.

In an example, the first and the second surface regions cover at least in some regions a surface of the insulation layer which runs parallel to the first side of the ceramic substrate with the resistance element arranged thereon.

Advantageously, the contact pads are arranged parallel to the first side of the substrate and of the printed circuit board. This arrangement allows a good contactability by means of the known bonding process.

In another example, the first and the second surface regions cover at least in some regions a surface of the insulation layer which runs perpendicular to the first side of the ceramic substrate with the resistance element arranged thereon.

The arrangement perpendicular to the first side of the ceramic substrate can alternatively or additionally to the arrangement occur parallel to the first side of the ceramic substrate. Advantageously, by a combination of the parallel and lateral arrangement of the surface regions, the surface of the contact pads can be further increased.

In an example, the first and/or second region(s) not covered by the insulation layer is/are designed in the form of an opening in the material of the insulation layer.

Advantageously, the material of the insulation layer surrounds the opening on which the contact pads can in turn be arranged. In an example, the maternal of the contact pads extends through the openings in order thus to electrically contact the connections of the resistance element.

In an alternative example, the first and the second region(s) not covered by the insulation layer is/are arranged on two opposite ends of the ceramic substrate, and each of the two connections is arranged on one of the opposite ends of the ceramic substrate.

In this example, the insulation layer is arranged in a central region on the ceramic substrate and extends only up to the connections of the resistance element. In this example, the openings are arranged on the sides of the insulation layer.

In another example, the insulation layer completely covers the first side of the ceramic substrate with the resistance element arranged thereon, and the first and/or the second region(s) not covered by the insulation layer is/are arranged at least in some regions on the ceramic substrate perpendicular to the first side of the ceramic substrate, and each of the first and/or of the second connection is arranged on one of two opposite ends of the ceramic substrate perpendicular to the first side of the ceramic substrate.

In another example, the ceramic substrate has a maximum length of 10 mm, a maximum width of 5 mm and a maximum height of 3 mm.

In yet another example, the insulation layer comprises a glass or glass ceramic material.

Advantageously, by means of a glass ceramic, an insulation layer with very good insulation properties can be produced, which, due to its good insulation properties, can be designed to be very thin.

In another example, the first and the second surface regions are adapted for wedge bonding of thick aluminum wire, in particular of thick aluminum wire with a diameter greater than or equal to 25 μm.

In yet another example, the sinterable metallization comprises a silver palladium metallization, and/or the ceramic substrate comprises an Al2O3 ceramic.

In another example, the metal layer comprises a structuring, a PT100 or PT1000 resistance element, in particular a Pt thin layer or thick layer resistance element with trimming section and is adapted for measuring a temperature, and wherein the structuring of the metal layer extends in a meandering pattern between the first connection and the second connection.

In yet another example, the metal layer comprises a material with a temperature coefficient of less than 500 ppm $K^{-1}$ at room temperature, in particular metal alloys containing chromium, nickel, iron, zinc, silver or palladium.

The invention also proposes a printed circuit board with at least one resistor component according to the invention arranged thereon.

Additional features and advantages of the invention result from the following description, in which preferred embodiments of the invention are explained in reference to diagrammatic drawings.

The figures show:

FIGS. 1*a*, 1*b*, 1*c*, 1*d* diagrammatic views of a structure of a resistance element according to a first embodiment of the invention; and FIGS. 2*a*, 2*b*, 2*c*, 2*d* diagrammatic views of a structure of a resistance element according to a second embodiment of the invention.

FIG. 1*a* shows a ceramic substrate 1 in the form of a rectangular solid according to a first embodiment of the invention. In the embodiment shown, the ceramic substrate 1 has a maximum length of 10 mm, a maximum width of 5 mm, and a maximum height of 3 mm. In the embodiment shown, the ceramic substrate 1 can comprise one or more materials from the group: Al2O3, AlSiC, AlN, B4C, BN, PBN, MgO, SiC, SiSiC, SSiC, Si3N4, YSZ or PZT. On a first side or the upper side of the ceramic substrate 1 opposite the second side, a sinterable metallization 3 is arranged. In the embodiment shown, the sinterable metallization 3 can comprise one material or multiple materials from the group: NiAu, NiPdAu, AgPd, AuPd, Cu, Au or Ag and can be arranged completely on the second side of the ceramic substrate 1.

Figure 1B:
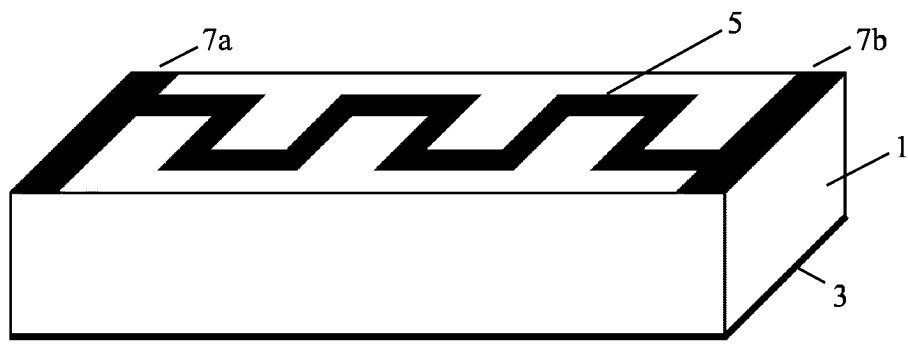

FIG. 1*b* shows the ceramic substrate 1 previously shown in FIG. 1*a*, with a resistance element designed as a structured metal layer 5 which is arranged on the first side of the ceramic substrate 1 with a first connection 7*a* and a second connection 7*b*.

As shown in FIG. 1*b*, the metal layer 5 is designed as a conducting path which, between its ends formed by the first connection 7*a* and the second connection 7*b*, runs in a meandering pattern and has a defined resistance value and temperature coefficient at a certain temperature. In the embodiment shown, each of the first connection 7a and of the second connection 7b is shown as a strip-like conducting path section. In an additional embodiment, the first and the second connections can also be formed simply by the conducting path ends of the conducting path arranged in a meandering pattern.

Figure 1C:
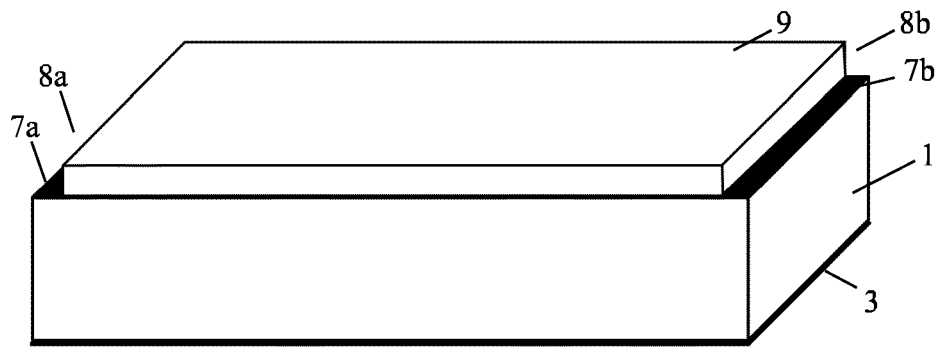

FIG. 1c shows the arrangement previously shown in FIG. 1b, with an insulation layer 9 on the metal layer 5 and on the first side of the ceramic substrate 1. As shown in FIG. 1c, a first region 8a on the first connection 7a and a second region 8b on the second connection 7b are not covered by the insulation layer 9. In the embodiment shown, the first region 8a and the second region 8b face one another and the insulation layer 9 is formed by a glass or glass ceramic material.

Figure 1D:
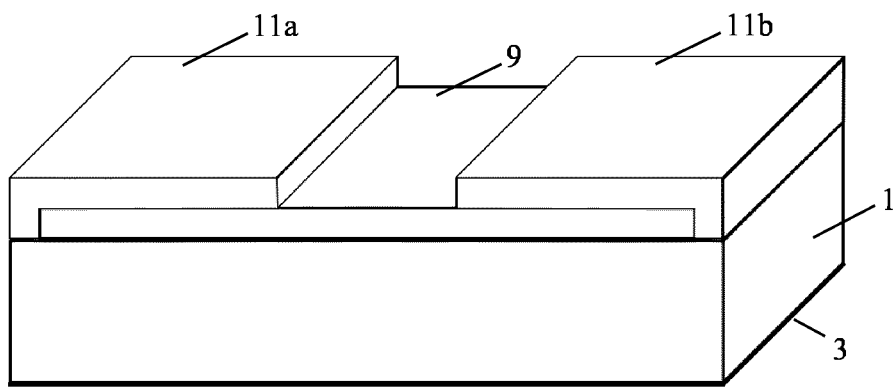

FIG. 1d shows the arrangement previously shown in FIG. 1c, with a first contact pad 11a which electrically contacts the first connection 7a via the first region 8a, and a second contact pad 11b which electrically contacts the second connection 7b via the second region 8b. The material of the respective contact pads 11a. 11b contacts the respective connection 7a, 7b, in order to achieve an electrical connection of the contact pads 11a, 11b to the connections 7a, 7b.

As shown in FIG. 1d, the contact pads 11a. 11b cover a region of the surface of the insulation layer 9 running parallel to the first side of the ceramic substrate 1 with the resistance element arranged thereon. In the embodiment shown, the contact pads 11a, 11b also cover a region of the surface of the insulation layer 9 running perpendicular to the first side of the ceramic substrate 1.

FIGS. 2a, 2b, 2c, 2d show additional diagrammatic views of a structure of resistance element according to a second embodiment of the invention.

Figure 2A:
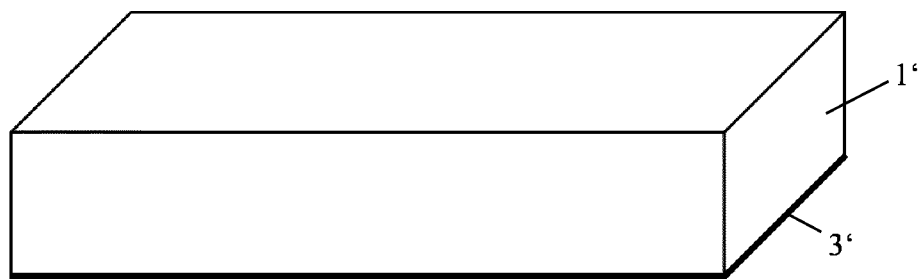
Figure 2B:

FIGS. 2a and 2b correspond to FIGS. 1a and 1b already shown above.

Figure 2C:
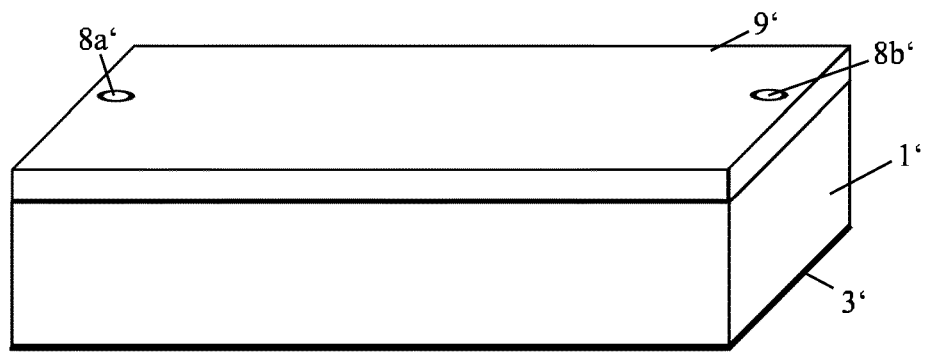

In FIG. 2c, the insulation layer is arranged substantially over the entire surface of the first side of the ceramic substrate 1' and in each case a recess 8a', 8b', in the form of an opening, is arranged in the material of the insulation layer 9' in order to allow an electrical contacting of the underlying connections 7a', 7b'.

As shown in FIG. 1c, a first region 8a' is arranged on the first connection 7a' and a second region 8b' is arranged on the second connection 7b' uncovered by the insulation layer 9'. In the embodiment shown, the first region 8a' and the second region 8b' face one another, and the insulation layer 9' is formed by a glass or glass ceramic material.

The connections 7a', 7b' can be contacted via an electrical conductor which extends through the openings and is in electrical contact with the material of the contact pads 11a', 11b'. Alternatively, a portion of the material of the contact pads 11a', 11b' can also extend through the openings and be in direct electrical contact with the connections 7a', 7b'.

Figure 2D:
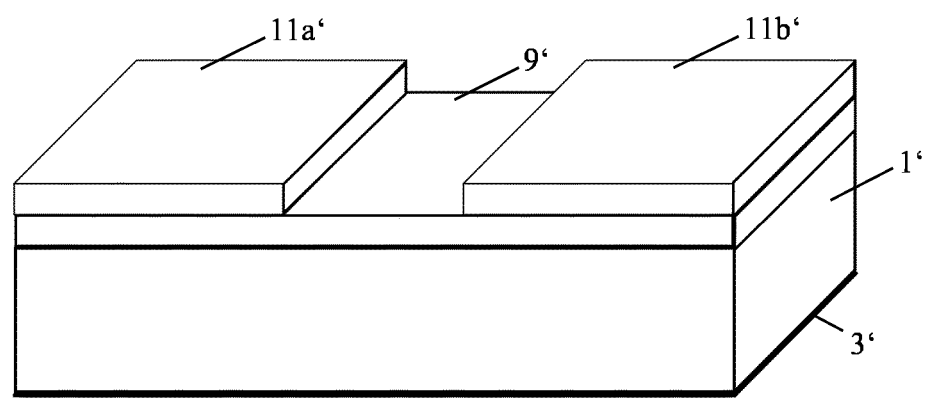

As shown in FIG. 2d, the contact pads 11a', 11b' cover a region of the surface of the insulation layer 9' running parallel to the first side of the ceramic substrate 1' with the resistance element arranged thereon.

In an additional embodiment (not shown), the resistance layer is designed to completely cover the substrate and without structuring on the substrate.

LIST OF REFERENCE NUMERALS 1, 1' Ceramic substrate
3, 3' Sinterable metallization
5, 5' Metal layer
7a, 7a' First connection
7b, 7b' Second connection
8a, 8a' First region
8b, 8b' Second region
9, 9' Insulation layer
11a, 11a' First contact pad
11b, 11b' Second contact pad

The invention claimed is:

1. A resistor component for surface mounting on a printed circuit board, comprising:
   a ceramic substrate with a first side and an opposite second side, wherein a sinterable metallization is at least in some regions arranged on the second side;
   a resistance element comprising a metal layer arranged at least in some regions on the first side of the ceramic substrate with a first connection and a second connection;
   an insulation layer arranged at least in some regions on the resistance element and the ceramic substrate, wherein a first region on the first connection and a second region on the second connection remain uncovered by the insulation layer; and
   a first contact pad which electrically contacts the first connection via the first region, and a second contact pad which electrically contacts the second connection via the second region;
   wherein the first contact pad at least in some regions covers a first surface region of the insulation layer and the second contact pad at least in some regions covers a second surface region of the insulation layer, and the first and the second contact pads are arranged spatially separated from one another on the insulation layer;
   wherein the metal layer comprises a Pt thin-film or thick-film resistance element with trimming section that measures a temperature, and wherein the structuring of the metal layer extends in a meandering pattern between the first connection and the second connection; and
   wherein the two contact pads arranged on the first side of the resister component are electrically insulated with respect to the metallized second side.

2. The resistor component according to claim 1, wherein the first and the second surface regions together cover at least 70% of a total surface of the insulation layer on the first side of the ceramic substrate.

3. The resistor component according to claim 1, wherein the first and the second surface regions at least in some regions cover a surface of the insulation layer which runs parallel to the first side of the ceramic substrate with the resistance element arranged thereon.

4. The resistor component according to claim 1, wherein the first and the second surface regions at least in some regions cover a surface of the insulation layer which runs perpendicular to the first side of the ceramic substrate with the resistance element arranged thereon.

5. The resistance element according to claim 1, wherein the first or the second region(s) not covered by the insulation layer are designed in the form of an opening in the material of the insulation layer.

6. The resistor component according to claim 1, wherein the first and the second regions not covered by the insulation layer are arranged on two opposite ends of the ceramic substrate and each of the first and the second connection is arranged on one of the two opposite ends.

7. The resistor component according to claim 1, wherein the insulation layer completely covers the first side of the ceramic substrate, with the resistance element arranged thereon, up to the first and second regions, and the first or the second region not covered by the insulation layer are arranged at least in some regions on the ceramic substrate perpendicular to the first side of the ceramic substrate, and each of the first and the second connection is arranged on one of two opposite ends of the ceramic substrate perpendicular to the first side of the ceramic substrate.

8. The resistor component according to claim 1, wherein the ceramic substrate has a maximum length of 10 mm, a maximum width of 5 mm and a maximum height of 3 mm.

9. The resistor component according to claim 1, wherein the insulation layer comprises a glass or glass ceramic material.

10. The resistor component according to claim 1, wherein the first and the second surface regions are configured to wedge bond aluminum thick wire having a diameter greater than or equal to 25 μm.

11. The resistor component according to claim 1, wherein the sinterable metallization comprises a silver-palladium metallization, and/or the ceramic substrate comprises an $Al_2O_3$ ceramic.

12. The resistor component according to claim 1, wherein the metal layer comprises a structuring, a PT100 or PT1000 resistance element, a thin Pt thin layer or thick layer resistance element with trimming section, and which is configured to measure a temperature, and wherein the structuring of the metal layer extends in a meandering pattern between the first connection and the second connection.

13. The resistor component according to claim 1, wherein the metal layer comprises a material having a temperature coefficient of less than 500 ppm $K^{-1}$ at room temperature, and metal alloys containing chromium, nickel, iron, zinc, silver or palladium.

14. A printed circuit board with at least one resistor component arranged thereon according to claim 1.

* * * * *